United States Patent
Lim et al.

(10) Patent No.: US 9,645,486 B2
(45) Date of Patent: May 9, 2017

(54) MULTIPLE THRESHOLD CONVERGENT OPC MODEL

(71) Applicant: GLOBALFOUNDRIES Inc., Grand Cayman (KY)

(72) Inventors: Chin Teong Lim, Clifton Park, NY (US); Guoxiang Ning, Ballston Lake, NY (US); Paul Ackmann, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 183 days.

(21) Appl. No.: 14/560,388

(22) Filed: Dec. 4, 2014

(65) Prior Publication Data
US 2016/0161840 A1   Jun. 9, 2016

(51) Int. Cl.
G06F 17/50    (2006.01)
G03F 1/36     (2012.01)

(52) U.S. Cl.
CPC ..................... *G03F 1/36* (2013.01)

(58) Field of Classification Search
CPC .......................................... G03F 1/36
See application file for complete search history.

(56) References Cited

U.S. PATENT DOCUMENTS

2010/0280812 A1* 11/2010 Zhang ................ G03F 7/70441
703/13

* cited by examiner

Primary Examiner — Vuthe Siek
(74) Attorney, Agent, or Firm — Ditthavong & Steiner, P.C.

(57) ABSTRACT

Methods of calibrating an OPC model using converged results of CD measurements from at least two locations along a substrate profile of a 1D, 2D, or critical area structure are provided. Embodiments include calibrating an OPC model for a structure to be formed in a substrate; simulating a CD of the structure at at least two locations along a substrate profile of the structure using the OPC model; comparing the simulated CD of the structure at each location against a corresponding measured CD; recalibrating the OPC model based on the comparing of each simulated CD against the corresponding measured CD; repeating the steps of simulating, comparing, and recalibrating until comparing at a first of the at least two locations converges to a first criteria and comparing at each other of the at least two locations converges to a corresponding criteria; and forming the structure using the recalibrated OPC model.

17 Claims, 5 Drawing Sheets

MULTIPLE THRESHOLD CONVERGENT OPC MODEL

TECHNICAL FIELD

The present disclosure relates to optical proximity correction (OPC) modeling for semiconductor devices. The present disclosure is particularly applicable to semiconductor devices having two-dimensional (2D) or critical area structures formed by photolithography.

BACKGROUND

Photolithographic masks are used to fabricate semiconductor devices such as integrated circuits (ICs). Currently, there is a continuing objective to increase the density with which various IC structures are arranged. As technology nodes decrease, the critical dimension (CD) of the structures to be printed on a silicon wafer is reduced and as the size of the structures becomes smaller than the wavelength of light used to pattern such structures, distortions may occur in the printed structures. To reduce the degree of distortions and to improve the resultant image quality, OPC, for example, may be performed on a design pattern before the pattern is created on a mask. Current OPC modeling software takes into account only one CD at a time. Generally, the single CD is taken close to the bottom of the resist profile, e.g., at 10% of the profile depth from the profile bottom, because proximity and polarization can affect the accuracy of a CD taken close to the top of the resist profile and, therefore, the final resist profile.

Figure 1:
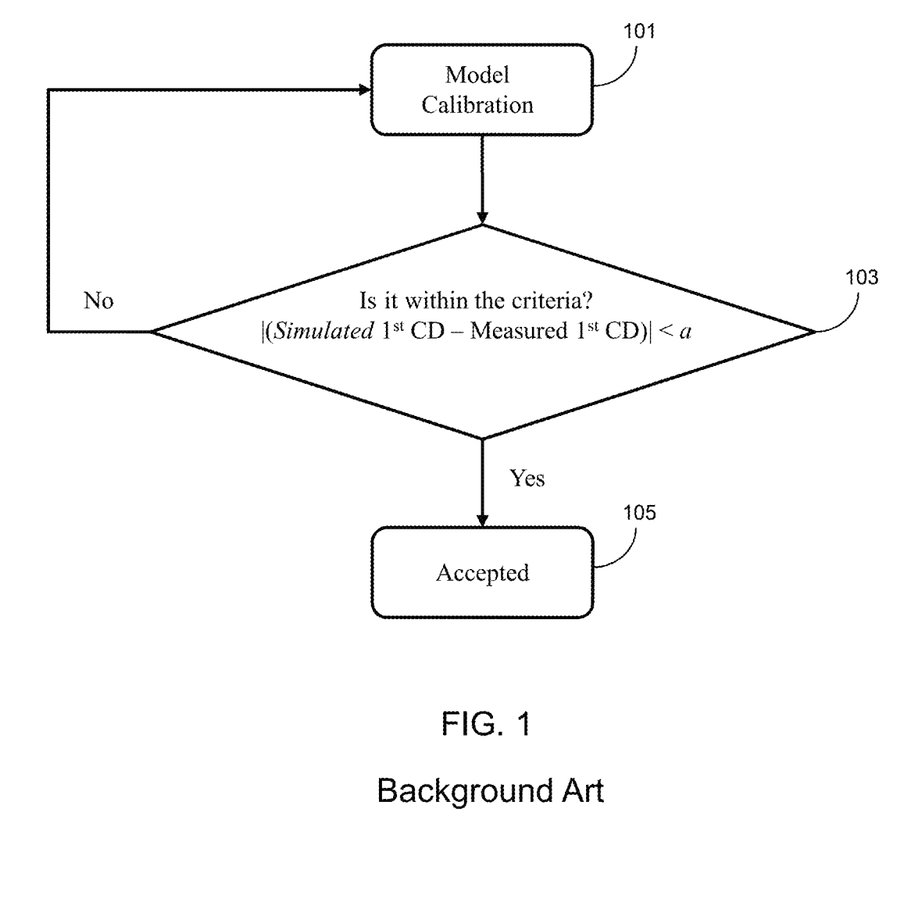
FIG. 1 illustrates a current OPC model calibration flow.

A known calibration process flow involves using a single CD measured close to the bottom of the resist profile as illustrated in FIG. 1. In step 101, the OPC model is calibrated by first forming the structure, e.g., a one-dimensional (1D) or 2D structure, in the substrate; measuring the CD of the structure; and inputting the measured CD into the OPC model. The calibrated OPC model then generates a simulated CD for the structure. In step 103, the difference between the simulated CD and the measured CD is determined. If the difference is determined to be equal to or greater than a criteria, e.g., criteria "a", then the OPC model is readjusted. Thereafter, the steps of simulating, determining, adjusting, and generating are repeated until the difference between the new simulated CD and the measured CD is determined to be less than the criteria, e.g., criteria "a". Because this calibration flow only considers a single CD measurement close to the profile bottom, the model calibration may lead to an inaccurate OPC model.

A need therefore exists for methodology enabling calibration of an OPC model based on at least two CD measurements from at least two locations along a substrate profile of a 1D, 2D, or critical area structure.

SUMMARY

An aspect of the present disclosure is a method of calibrating an OPC model using converged results of CD measurements from at least two locations along a substrate profile of a 1D, 2D, or critical area structure.

Another aspect of the present disclosure is an apparatus that calibrates an OPC model using converged results of CD measurements from at least two locations along a substrate of a 1D, 2D, or critical area structure.

A further aspect of the present disclosure is an apparatus that calibrates an OPC model based on a function of two or more functions derived from CD measurements from at least two locations along a substrate of a 1D, 2D, or critical area structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: calibrating an OPC model for a structure to be formed in a substrate; simulating a CD of the structure at at least two locations along a substrate profile of the structure using the OPC model; comparing the simulated CD of the structure at the at least two locations along the substrate profile against a measured CD at the at least two locations along the substrate profile; recalibrating the OPC model based on the comparing of the simulated CD against the measured CD at the at least two locations along the substrate profile; repeating the steps of simulating, comparing, and recalibrating until comparing at a first of the at least two locations along the substrate profile converges to a first criteria and comparing at each other of the at least two locations along the substrate profile converges to a corresponding criteria; and forming the structure using the recalibrated OPC model.

Aspects of the present disclosure include calibrating the OPC model by: forming a 1D or 2D structure in the substrate using photolithography; measuring the CD of the 1D or 2D structure at the at least two locations along the substrate profile; and modifying the OPC model based on the measured CD at each measured location along the substrate profile. Other aspects include recalibrating the OPC model by: determining a first difference between the simulated CD and the measured CD at the first of the at least two locations along the substrate profile; adjusting the OPC model if the first difference is equal to or greater than a first criteria; generating a new simulated CD at the at least two locations along the substrate profile according to the adjusted OPC model; iterating the steps of determining, adjusting, and generating for the first of the at least two locations along the substrate profile until the first difference between the new simulated CD at the first location and the measured CD at the first location is less than the first criteria; determining a second difference between the new simulated CD at the second of the at least two locations along the substrate profile corresponding to the new simulated CD at the second location and the measured CD at the second location; adjusting the OPC model if the second difference is equal to or greater than a second criteria; generating an other new simulated CD at the at least two locations along the substrate profile according to the adjusted OPC model; and iterating the steps of determining, adjusting, and generating for the second of the at least two locations along the substrate profile until the second difference between the other new simulated CD at the second location and the measured CD at the second location is less than the second criteria; and repeating the steps of determining, adjusting, generating, and iterating for each additional measured location along the substrate profile. Further aspects include, wherein the OPC model comprises an OPC submodel corresponding to each of the at least two locations along the substrate profile, the method comprising recalibrating the OPC model for each of the at least two locations along the substrate profile by: determining a difference between the simulated CD and the measured CD; adjusting the first OPC submodel if the difference is equal to or greater than a corresponding criteria; generating a new simulated CD at the location along the substrate profile according to the adjusted corresponding OPC submodel; and iterating the steps of determining, adjusting, and generating for the location along the substrate profile until the difference between the new simulated CD at the location along the substrate profile and the measured CD at the location along the substrate profile is less than the corresponding criteria. Another aspect includes the substrate being formed of a patterned photoresist layer and/or an etched silicon wafer. Additional aspects include determining whether a structure to be formed is one dimensional or two dimensional prior to calibrating. Other aspects, wherein the structure is one dimensional, include forming the structure in the substrate using photolithography; measuring a CD of the structure; calibrating an OPC model based on the measured CD; simulating the CD of the structure; determining a difference between the simulated CD and the measured CD; adjusting the OPC model if the difference is equal to or greater than a criteria; generating a new simulated CD according to the adjusted OPC model; repeating the steps of simulating, determining, adjusting, and generating until the difference between the new simulated CD and the measured CD is less than the criteria; and forming the structure in the substrate based on the adjusted OPC model. Additional aspects, wherein the structure is two dimensional, include forming the two-dimensional structure in the substrate using photolithography; measuring the CD of the two-dimensional structure at each of the at least two locations along the substrate profile; calibrating the OPC model based on the measured CD at each of the at least two locations along the substrate profile; simulating the CD of the two-dimensional structure at each of the at least two locations along the substrate profile of the structure using the calibrated OPC model; and for each location of the at least two locations: determining a difference between the simulated CD and the measured CD at the location along the substrate profile; adjusting a corresponding OPC submodel if the difference is equal to or greater than a corresponding criteria; generating a new simulated CD at the location along the substrate profile according to the adjusted OPC submodel; and iterating the steps of determining, adjusting, and generating until the difference between the new simulated CD at the location and the measured CD at the location is less than the corresponding criteria.

Another aspect of the present disclosure is an apparatus including: a processor; and a memory including computer program code for one or more programs, the memory and the computer program code configured to, with the processor, cause the apparatus to perform the following: calibrate an OPC model for a structure to be formed in a substrate; simulate a CD of the structure at at least two locations along a substrate profile of the structure using the OPC model; compare the simulated CD of the structure at the at least two locations along the substrate profile against a measured CD at the at least two locations along the substrate profile; recalibrate the OPC model based on the comparing of the simulated CD against the measured CD at the at least two locations along the substrate profile; repeat the steps of simulating, comparing, and recalibrating until comparing at a first of the at least two locations along the substrate profile converges to a first criteria and comparing at each other of the at least two locations along the substrate profile converges to a corresponding criteria; and form the structure using the recalibrated OPC model.

Aspects of include the apparatus being further caused, with respect to calibrating the OPC model, to: form a 1D or 2D structure in the substrate using photolithography; measure the CD of the 1D or 2D structure at the at least two locations along the substrate profile; and modify the OPC model based on the measured CD at each measured location along the substrate profile. Other aspects include the apparatus being further caused, with respect to recalibrating the OPC model, to: determine a first difference between the simulated CD and the measured CD at the first of the at least two locations along the substrate profile; adjust the OPC model if the first difference is equal to or greater than a first criteria; generate a new simulated CD at the at least two locations along the substrate profile according to the adjusted OPC model; iterate the steps of determining, adjusting, and generating for the first of the at least two locations along the substrate profile until the first difference between the new simulated CD at the first location and the measured CD at the first location is less than the first criteria; determine a second difference between the new simulated CD at the second of the at least two locations along the substrate profile corresponding to the new simulated CD at the second location and the measured CD at the second location; adjust the OPC model if the second difference is equal to or greater than a second criteria; generate an other new simulated CD at the at least two locations along the substrate profile according to the adjusted OPC model; and iterate the steps of determining, adjusting, and generating for the second of the at least two locations along the substrate profile until the second difference between the other new simulated CD at the second location and the measured CD at the second location is less than the second criteria; and repeat the steps of determining, adjusting, generating, and iterating for each additional measured location along the substrate profile. Further aspects, wherein the OPC model comprises an OPC submodel corresponding to each of the at least two locations along the substrate profile, the apparatus is further caused, with respect to recalibrating the OPC model for each of the at least two locations along the substrate profile, to: determine a difference between the simulated CD and the measured CD; adjust the first OPC submodel if the difference is equal to or greater than a corresponding criteria; generate a new simulated CD at the location along the substrate profile according to the adjusted corresponding OPC submodel; and iterate the steps of determining, adjusting, and generating for the location along the substrate profile until the difference between the new simulated CD at the location along the substrate profile and the measured CD at the location along the substrate profile is less than the corresponding criteria. Another aspect includes the substrate being formed of a patterned photoresist layer and/or an etched silicon wafer. Additional aspects include the apparatus being further caused to: determine whether the structure to be formed is 1D or 2D prior to performing the calibration. Other aspects include the apparatus being further caused, with respect to a one-dimensional structure, to: form the structure in the substrate using photolithography; measure a CD of the structure; calibrate an OPC model based on the measured CD; simulate the CD of the structure; determine a difference between the simulated CD and the measured CD; adjust the OPC model if the difference is equal to or greater than a criteria; generate a new simulated CD according to the adjusted OPC model; repeat the steps of simulating, determining, adjusting, and generating until the difference between the new simulated CD and the measured CD is less than the criteria; and form the structure in the substrate based on the adjusted OPC model. Further aspects include the apparatus being further caused, with respect to forming a 2D structure, to: form the 2D structure in the substrate using photolithography; measure the CD of the 2D structure at each of the at least two locations along the substrate profile; calibrate the OPC model based on the measured CD at each of the at least two locations along the substrate profile; simulate the CD of the 2D structure at each of the at least two locations along the substrate profile of the structure using the calibrated OPC model; and for each location of the at least two locations: determine a difference between the simulated CD and the measured CD at the location along the substrate profile; adjust a corresponding OPC submodel if the difference is equal to or greater than a corresponding criteria; generate a new simulated CD at the location along the substrate profile according to the adjusted OPC submodel; and iterating the steps of determining, adjusting, and generating until the difference between the new simulated CD at the location and the measured CD at the location is less than the corresponding criteria.

A further aspect of the present disclosure is an apparatus including: a processor; and a memory including computer program code for one or more programs, the memory and the computer program code configured to, with the processor, cause the apparatus to perform the following, form a structure in a substrate using photolithography; measure a first CD of the structure at a first location along a substrate profile of the structure; determine a first function of the measured first CD and one or more optical, substrate, or statistical approximation characteristics; measures a second CD of the structure at a second location along the substrate profile of the structure; determine a second function of the measured second CD and one or more optical, substrate, or statistical approximation characteristics; calibrate an OPC model based on the first and second functions; and form the structure using the calibrated OPC model. Aspects include the apparatus being further caused, with respect to calibrating the OPC model, to: add the first function to the second function; and calibrate the OPC model based on a sum of the added first and second functions. Other aspects include the apparatus being further caused, with respect to calibrating the OPC model, to: determine a delta between the first function and the second function; add the delta to either the first function or the second function; and calibrate the OPC model based on a sum of the added delta and either the first or second functions. Further aspects include the substrate being formed of a patterned photoresist layer and/or an etched silicon wafer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of inaccurate OPC modeling of photolithographically forming a 1D, 2D, or critical area structure attendant upon utilizing an OPC model calibrated with a CD measurement from a single location along a substrate profile of the structure.

Methodology in accordance with embodiments of the present disclosure includes calibrating an OPC model for a structure to be formed in a substrate. A CD of the structure is simulated at at least two locations along a substrate profile of the structure using the OPC model. The simulated CD of the structure at the at least two locations along the substrate profile is compared against a measured CD at the at least two locations along the substrate profile. The OPC model is recalibrated based on the comparing of the simulated CD against the measured CD at the at least two locations along the substrate profile. The steps of simulating, comparing, and recalibrating are repeated until comparing at a first of the at least two locations along the substrate profile converges to a first criteria and comparing at each other of the at least two locations along the substrate profile converges to a corresponding criteria. The structure is then formed using the recalibrated OPC model.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
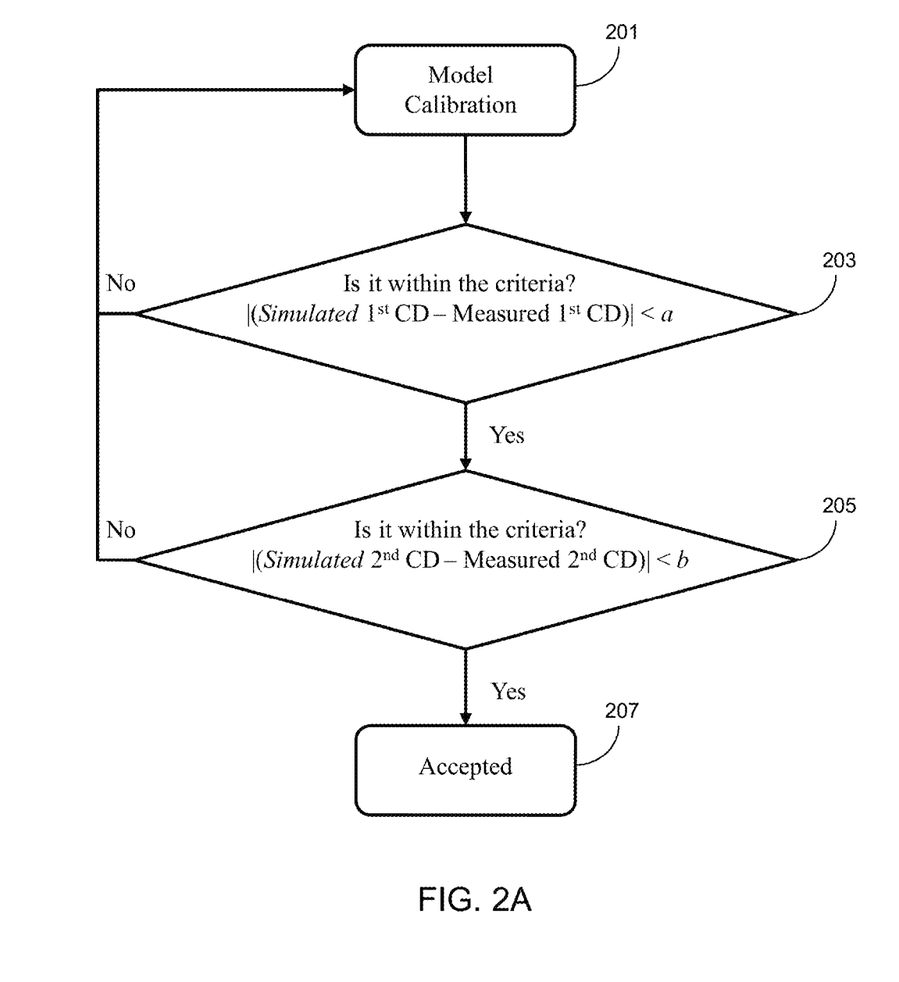
FIGS. 2A and 2B illustrate convergent OPC model calibration flows based on at least two CD measurements along a structure profile, in accordance with an exemplary embodiment.

Adverting to FIG. 2A, in step 201, an OPC model for forming a structure, e.g., a 1D, 2D, or critical area structure, on a substrate is calibrated by first forming the structure in the substrate using photolithography. A critical area structure may be formed, for example, between two other structures. The substrate may be a patterned photoresist and/or an etched silicon wafer. A CD of the structure may then be measured at at least two locations along the substrate profile.

In general, the at least two locations may correspond to a lower and an upper portion (threshold) along the substrate profile. For example, the lower portion may be measured at 5-10% of the overall profile depth from the bottom and the upper portion may be measured at 80-90% of the overall profile depth from the bottom. Other portions of the substrate profile may also be measured at the same time, e.g., at 40-60% of the overall profile depth from the bottom. The CD may be measured from at least two locations along the patterned photoresist profile, at least two locations along the etched silicon wafer profile, or at least two locations from both the patterned photoresist profile and the etched silicon wafer profile. The OPC model is then modified by inputting the measured CD from each location along the substrate profile into the OPC model. Consequently, the calibrated OPC model generates a simulated CD for each of the at least two locations based on the corresponding measured CD.

In step 203, the difference between the simulated CD of the structure at a first of the at least two locations and the corresponding measured CD is determined. The difference is then compared against a corresponding criteria, e.g., criteria "a". For example, if the CD is a diameter of a structure, the criteria may be 1 nm to 10 nm, e.g., 3 nm to 4 nm. Alternatively, the CD may be a cross-sectional area. Next, if the difference is determined to be equal or greater than the corresponding criteria, then the OPC model of step 201 is adjusted and a new simulated CD for each of the at least two locations is generated. The steps of determining, adjusting, and generating are then repeated for the first of the at least two locations until the difference between the new simulated CD at the first of the at least two locations and the corresponding measured CD is determined to be less than the corresponding criteria.

In step 205, the processes described in step 203 are largely repeated with respect to a second of the at least two locations. A difference between the new simulated CD for the second of the at least two locations and the corresponding measured CD is determined. The difference for the second of the at least two locations is then compared against a corresponding criteria, e.g., criteria "b", which may or may not be the same as criteria "a". If the difference is determined to be equal to or greater than corresponding criteria, then the OPC model is readjusted and a new simulated CD at each of the at least two locations is generated. As in step 203, the steps of determining, adjusting, and generating are repeated until both the difference between the new simulated CD at the first of the at least two locations and the corresponding measured CD is determined to be less than the corresponding criteria, e.g., criteria "a", and the difference between the new simulated CD at the second of the at least two locations and the corresponding measured CD is determined to be less than the corresponding criteria, e.g., criteria "b". Once the comparison of the first of the at least two locations converges to criteria "a", for example, and the comparison of the second of the at least two locations converges to criteria "b", for example, the recalibrated OPC model is accepted in step 207 and may then be used to form the structure during production.

Figure 2B:
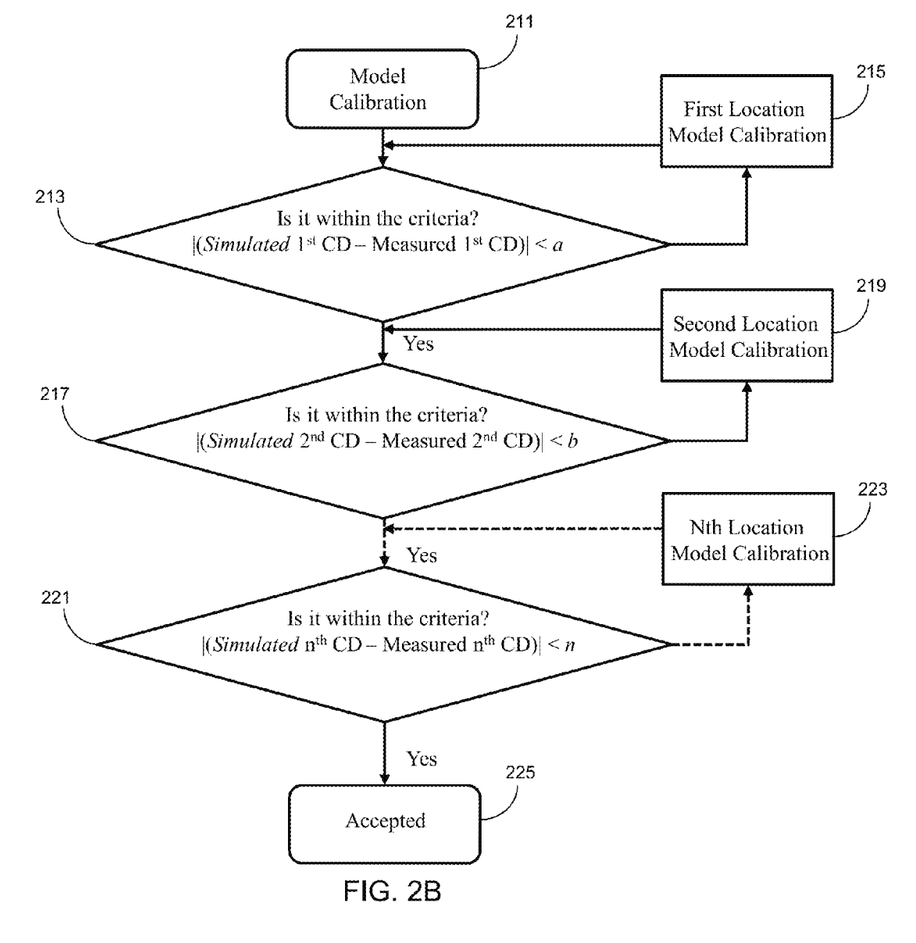

Adverting to FIG. 2B, in step 211, similar to step 201 of FIG. 2A, an OPC model is calibrated by first inputting into the OPC model the measured CD from each of the at least two locations along a substrate profile. The calibrated OPC model then generates a simulated CD for each of the at least two locations based on the measured CD at each corresponding location. In step 213, similar to step 203 of FIG. 2A, the difference between the simulated CD at the first of the at least two locations and the corresponding measured CD is determined and then compared against a corresponding criteria, e.g., criteria "a". However, unlike the OPC model in FIG. 2A, the OPC model in FIG. 2B includes a submodel for each location measured along the substrate profile. Consequently, if the difference is determined to be equal to or greater than the corresponding criteria, e.g., criteria "a", then the OPC submodel corresponding to that location, e.g., the first of the at least two locations, is adjusted in step 215. A new simulated CD for the first of the at least two locations is then generated according to the adjusted corresponding OPC submodel. Thereafter, the steps of determining, adjusting, and generating for the particular location along the substrate profile are repeated until the difference between the new simulated CD at the first of the at least two locations and the corresponding measured CD is determined to be less than the corresponding criteria, e.g., criteria "a".

In steps 217 and 219, the processes described in steps 213 and 215 are repeated with respect to the second of the at least two locations. The difference between the simulated CD at the second of the least two locations and the corresponding measured CD is determined and then compared against a corresponding criteria, e.g., criteria "b". If the difference is determined to be equal to or greater than the corresponding criteria, then the OPC submodel corresponding to that location, e.g., the second of the at least two locations, is adjusted in step 219. A new simulated CD for the second of the at least two locations is then generated according to the adjusted corresponding OPC submodel. Thereafter, the steps of determining, adjusting, and generating are repeated until the difference between the new simulated CD at the second of the at least two locations and the corresponding measured CD is determined to be less than the corresponding criteria, e.g., criteria "b".

Steps 221 and 223 are representative of the fact that the processes described in steps 217 and 219 may be repeated for each other location measured along the substrate profile in addition to the at least two locations described with respect to steps 213, 215, 217, and 219. For example, steps 221 and 223 would correspond to a third location measured along the substrate profile; steps 225 and 227 would correspond to a fourth location measured along the substrate profile; and so forth. Once the comparison of the first of the at least two locations converges to the corresponding criteria, e.g., criteria "a", the comparison of the second of the at least two locations converges to the corresponding criteria, e.g., criteria "b", and the comparison of each other measured location along the substrate profile converges to the corresponding criteria, e.g., criteria "n", the recalibrated OPC model is accepted in step 225 and may then be used to form the structure during production.

Figure 3:
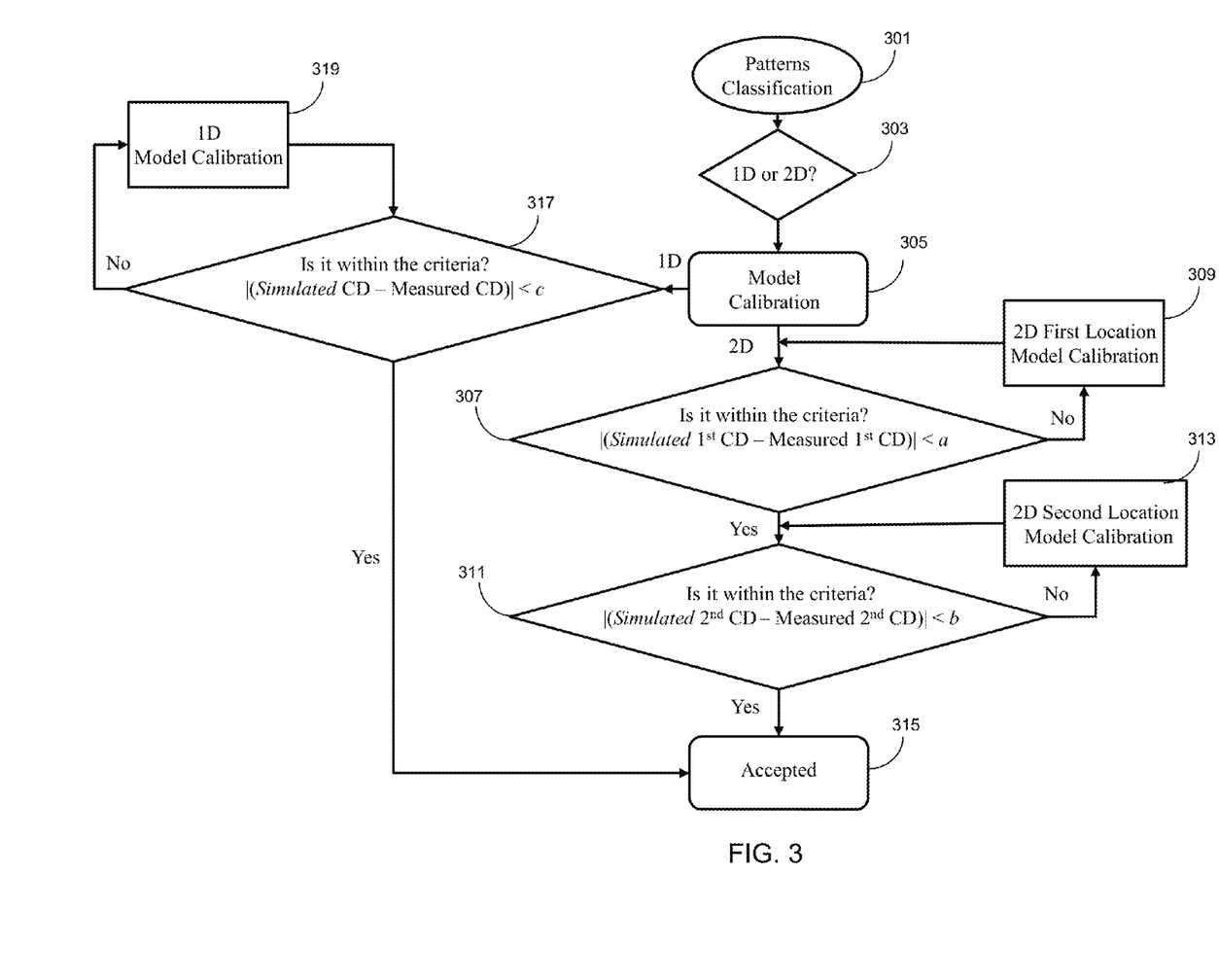
FIG. 3 illustrates a convergent OPC model calibration flow based on at least two CD measurements along a structure profile after pattern classification, in accordance with an exemplary embodiment.

Adverting to FIG. 3, the process flow of FIG. 3 is similar to that of FIG. 2B, except that the process flow of FIG. 3 also includes a 1D or 2D pattern classification step in advance of initially calibrating the OPC model. In step 301, a variety of different feature patterns may, for example, be classified as 1D, e.g., a straight bar, or as 2D, for example, an L-shaped bar. In step 303, the OPC model or an operator determines whether the to-be-formed structure is 1D or 2D. In step 305, the OPC model is calibrated based on the determined dimensionality of the structure. If the structure is determined to be 2D, then steps 305 through 315 of FIG. 3 follow steps 211 through 221 of FIG. 2B, respectively.

However, if the structure is determined to be 1D, then the OPC model is calibrated in step 305 by first forming the 1D structure, e.g., a straight bar, in the substrate. The CD of the structure is then measured and the OPC model is calibrated based on the measured CD. Consequently, the calibrated OPC model generates a simulated CD for the 1D structure. In step 317, the difference between the simulated CD and the corresponding measured CD is determined. If the difference is determined to be equal or greater than a corresponding criteria, e.g., criteria "c", then the OPC model is adjusted in step 319. For example, if the CD is of a 1D structure, the criteria may be 1 nm to 10 nm, e.g., 2 nm. A new simulated CD is generated according to the adjusted OPC model. Thereafter, the steps of simulating, determining, adjusting, and generating are repeated until the difference between the new simulated CD and the corresponding measured CD is determined to be less than the corresponding criteria. Once the difference is less than the corresponding criteria, the adjusted OPC model is accepted in step 315 and may then be used to form the one-dimensional structure during production. Similar to steps 221 and 223 of FIG. 2B, corresponding steps may be repeated in FIG. 3 after step 313 for each other location measured along the substrate profile in addition to the at least two locations.

Figure 4:
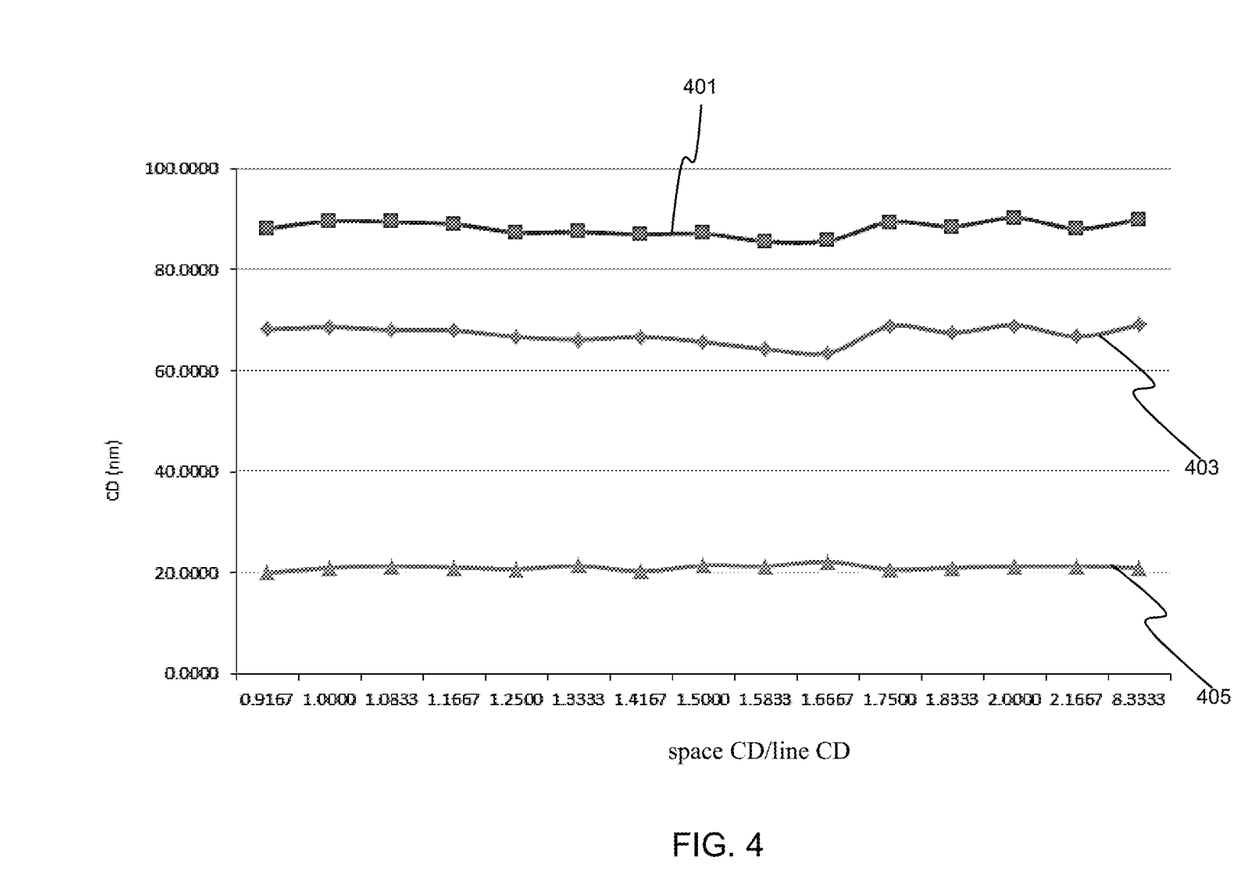
FIG. 4 illustrates sample OPC calibration functions determined from two locations along a substrate profile of a structure, in accordance with an exemplary embodiment.

Adverting to FIG. 4, a first CD of a structure, e.g., a 1D, 2D, or critical area structure, is measured at a first location along a substrate profile of the structure. Each measured CD at the first location is represented as a dot along line 401. A first function, e.g., $f(x)_1$, of the measured first CD is determined based on each measured CD and one or more optical or substrate characteristics, e.g., intensity (Imin and Imax), contrast, diffusion rate, developing rate, etc., and/or one or more statistical approximation characteristics, e.g., gaussion, tophat density kernel, etc. A first submodel could also be formed corresponding to the first location along the substrate profile of the structure and the first submodel could then be calibrated based on the measured first CD. Thereafter, the calibration of the first submodel or other approximation techniques could be part of the determining of the first function. Next, a second CD is measured at a second location along the substrate profile of the structure. Each measured CD at the second location is represented as a dot along line 403. A second function, e.g., $f(x)_2$, of the measured second CD is determined based on the optical, substrate, or statistical approximation characteristics of the first function. As with the first location along the substrate profile, a second submodel could be formed corresponding to the second location along the substrate profile of the structure and the second submodel could then be calibrated based on the measured second CD. Thereafter, the calibration of the second submodel or other approximation techniques could be part of the determining of the second function. The OPC model is then calibrated based on a function of the first and second functions. In particular, the OPC model may be calibrated based on the sum of the first and second functions, e.g., $F(x)=f(x)_1+f(x)_2$. Alternatively, a delta as represented by line 405 may be determined between the first and second functions. The OPC model may then be calibrated based on the sum of the delta and either the first or second functions, e.g., $F(x)=f(x)+DeltaCD$, wherein Delta $CD=A_0+\Sigma A_i x^i$ (i=1). Thereafter, the calibrated OPC model may be used to form the structure in production.

The embodiments of the present disclosure can achieve several technical effects including achieving better Model-OPC accuracy by taking into account converged results of CD measurements from at least two locations along a substrate profile of a structure, increased OPC quality, and better prediction of the relative process window. Embodiments of the present disclosure enjoy utility in various industrial applications as, for example, microprocessors, smart phones, mobile phones, cellular handsets, set-top boxes, DVD recorders and players, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    calibrating an optical proximity correction (OPC) model for a structure to be formed in a substrate;
    simulating a critical dimension (CD) of the structure at at least two locations along a substrate profile of the structure using the OPC model;
    comparing the simulated CD of the structure at the at least two locations along the substrate profile against a measured CD at the at least two locations along the substrate profile;
    recalibrating the OPC model based on the comparing of the simulated CD against the measured CD at the at least two locations along the substrate profile;
    repeating the steps of simulating, comparing, and recalibrating until comparing at a first of the at least two locations along the substrate profile converges to a first criteria and comparing at each other of the at least two locations along the substrate profile converges to a corresponding criteria;
    forming the structure in the substrate by photolithography using the recalibrated OPC model,
    wherein the OPC model comprises an OPC submodel corresponding to each of the at least two locations along the substrate profile, the method comprising recalibrating the OPC model for each of the at least two locations along the substrate profile by:
        determining a difference between the simulated CD and the measured CD;
        adjusting the first OPC submodel if the difference is equal to or greater than a corresponding criteria;
        generating a new simulated CD at the location along the substrate profile according to the adjusted corresponding OPC submodel; and
        iterating the steps of determining, adjusting, and generating for the location along the substrate profile until the difference between the new simulated CD at the location along the substrate profile and the measured CD at the location along the substrate profile is less than the corresponding criteria.

2. The method according to claim 1, comprising calibrating the OPC model by:
    forming a one-dimensional or a two-dimensional structure in the substrate using photolithography;
    measuring the CD of the one-dimensional or two-dimensional structure at the at least two locations along the substrate profile; and
    modifying the OPC model based on the measured CD at each measured location along the substrate profile.

3. The method according to claim 1, comprising recalibrating the OPC model by:

determining a first difference between the simulated CD and the measured CD at the first of the at least two locations along the substrate profile;

adjusting the OPC model if the first difference is equal to or greater than a first criteria;

generating a new simulated CD at the at least two locations along the substrate profile according to the adjusted OPC model;

iterating the steps of determining, adjusting, and generating for the first of the at least two locations along the substrate profile until the first difference between the new simulated CD at the first location and the measured CD at the first location is less than the first criteria;

determining a second difference between the new simulated CD at the second of the at least two locations along the substrate profile corresponding to the new simulated CD at the second location and the measured CD at the second location;

adjusting the OPC model if the second difference is equal to or greater than a second criteria;

generating an other new simulated CD at the at least two locations along the substrate profile according to the adjusted OPC model; and iterating the steps of determining, adjusting, and generating for the second of the at least two locations along the substrate profile until the second difference between the other new simulated CD at the second location and the measured CD at the second location is less than the second criteria; and repeating the steps of determining, adjusting, generating, and iterating for each additional measured location along the substrate profile.

4. The method according to claim 1, wherein the substrate comprises a patterned photoresist layer and/or an etched silicon wafer.

5. The method according to claim 1, further comprising determining whether a structure to be formed is one dimensional or two dimensional prior to calibrating.

6. The method according to claim 5, wherein if the structure is one dimensional, the method further comprising:
   forming the structure in the substrate using photolithography;
   measuring a CD of the structure;
   calibrating an OPC model based on the measured CD;
   simulating the CD of the structure;
   determining a difference between the simulated CD and the measured CD;
   adjusting the OPC model if the difference is equal to or greater than a criteria;
   generating a new simulated CD according to the adjusted OPC model;
   repeating the steps of simulating, determining, adjusting, and generating until the difference between the new simulated CD and the measured CD is less than the criteria; and
   forming the structure in the substrate based on the adjusted OPC model.

7. The method according to claim 5, wherein the structure is two dimensional, the method further comprising:
   forming the two-dimensional structure in the substrate using photolithography;
   measuring the CD of the two-dimensional structure at each of the at least two locations along the substrate profile;
   calibrating the OPC model based on the measured CD at each of the at least two locations along the substrate profile;
   simulating the CD of the two-dimensional structure at each of the at least two locations along the substrate profile of the structure using the calibrated OPC model; and
   for each location of the at least two locations:
      determining a difference between the simulated CD and the measured CD at the location along the substrate profile;
      adjusting a corresponding OPC submodel if the difference is equal to or greater than a corresponding criteria;
      generating a new simulated CD at the location along the substrate profile according to the adjusted OPC submodel; and
      iterating the steps of determining, adjusting, and generating until the difference between the new simulated CD at the location and the measured CD at the location is less than the corresponding criteria.

8. An apparatus comprising:
a processor; and
a memory including computer program code for one or more programs, the memory and the computer program code configured to, with the processor, cause the apparatus to perform the following,
   calibrate an optical proximity correction (OPC) model for a structure to be formed in a substrate;
   simulate a critical dimension (CD) of the structure at at least two locations along a substrate profile of the structure using the OPC model;
   compare the simulated CD of the structure at the at least two locations along the substrate profile against a measured CD at the at least two locations along the substrate profile;
   recalibrate the OPC model based on the comparing of the simulated CD against the measured CD at the at least two locations along the substrate profile;
   repeat the steps of simulating, comparing, and recalibrating until comparing at a first of the at least two locations along the substrate profile converges to a first criteria and comparing at each other of the at least two locations along the substrate profile converges to a corresponding criteria; and
   form the structure in the substrate by photolithography using the recalibrated OPC model,
   wherein the OPC model comprises an OPC submodel corresponding to each of the at least two locations along the substrate profile, the apparatus is further caused, with respect to recalibrating the OPC model for each of the at least two locations along the substrate profile, to:
   determine a difference between the simulated CD and the measured CD;
   adjust the first OPC submodel if the difference is equal to or greater than a corresponding criteria;
   generate a new simulated CD at the location along the substrate profile according to the adjusted corresponding OPC submodel; and
   iterate the steps of determining, adjusting, and generating for the location along the substrate profile until the difference between the new simulated CD at the location along the substrate profile and the measured CD at the location along the substrate profile is less than the corresponding criteria.

9. The apparatus according to claim 8, wherein the apparatus is further caused, with respect to calibrating the OPC model, to:

form a one-dimensional or a two-dimensional structure in the substrate using photolithography;
measure the CD of the one-dimensional or two-dimensional structure at the at least two locations along the substrate profile; and
modify the OPC model based on the measured CD at each measured location along the substrate profile.

10. The apparatus according to claim 8, wherein the apparatus is further caused, with respect to recalibrating the OPC model, to:
determine a first difference between the simulated CD and the measured CD at the first of the at least two locations along the substrate profile;
adjust the OPC model if the first difference is equal to or greater than a first criteria;
generate a new simulated CD at the at least two locations along the substrate profile according to the adjusted OPC model;
iterate the steps of determining, adjusting, and generating for the first of the at least two locations along the substrate profile until the first difference between the new simulated CD at the first location and the measured CD at the first location is less than the first criteria;
determine a second difference between the new simulated CD at the second of the at least two locations along the substrate profile corresponding to the new simulated CD at the second location and the measured CD at the second location;
adjust the OPC model if the second difference is equal to or greater than a second criteria;
generate an other new simulated CD at the at least two locations along the substrate profile according to the adjusted OPC model; and
iterate the steps of determining, adjusting, and generating for the second of the at least two locations along the substrate profile until the second difference between the other new simulated CD at the second location and the measured CD at the second location is less than the second criteria; and
repeat the steps of determining, adjusting, generating, and iterating for each additional measured location along the substrate profile.

11. The apparatus according to claim 8, wherein the substrate comprises a patterned photoresist layer and/or an etched silicon wafer.

12. The apparatus according to claim 8, wherein the apparatus is further caused to:
determine whether the structure to be formed is one dimensional or two dimensional prior to performing the calibration.

13. The method according to claim 12, wherein the apparatus is further caused, with respect to a one-dimensional structure, to:
form the structure in the substrate using photolithography;
measure a CD of the structure;
calibrate an OPC model based on the measured CD;
simulate the CD of the structure;
determine a difference between the simulated CD and the measured CD;
adjust the OPC model if the difference is equal to or greater than a criteria;
generate a new simulated CD according to the adjusted OPC model;
repeat the steps of simulating, determining, adjusting, and generating until the difference between the new simulated CD and the measured CD is less than the criteria; and form the structure in the substrate based on the adjusted OPC model.

14. The method according to claim 12, wherein the apparatus is further caused, with respect to forming a two-dimensional structure, to:
form the two-dimensional structure in the substrate using photolithography;
measure the CD of the two-dimensional structure at each of the at least two locations along the substrate profile;
calibrate the OPC model based on the measured CD at each of the at least two locations along the substrate profile;
simulate the CD of the two-dimensional structure at each of the at least two locations along the substrate profile of the structure using the calibrated OPC model; and
for each location of the at least two locations:
determine a difference between the simulated CD and the measured CD at the location along the substrate profile;
adjust a corresponding OPC submodel if the difference is equal to or greater than a corresponding criteria;
generate a new simulated CD at the location along the substrate profile according to the adjusted OPC submodel; and
iterating the steps of determining, adjusting, and generating until the difference between the new simulated CD at the location and the measured CD at the location is less than the corresponding criteria.

15. An apparatus comprising:
a processor; and
a memory including computer program code for one or more programs, the memory and the computer program code configured to, with the processor, cause the apparatus to perform the following,
form a structure in a substrate using photolithography;
measure a first critical dimension (CD) of the structure at a first location along a substrate profile of the structure;
determine a first function of the measured first CD and one or more optical, substrate, or statistical approximation characteristics;
measures a second CD of the structure at a second location along the substrate profile of the structure;
determine a second function of the measured second CD and one or more optical, substrate, or statistical approximation characteristics;
calibrate an optical proximity correction (OPC) model based on the first and second functions;
form the structure in the substrate by photolithography using the calibrated OPC model; and
with respect to calibrating the OPC model, to:
add the first function to the second function; and
calibrate the OPC model based on a sum of the added first and second functions.

16. The apparatus according to claim 15, wherein the apparatus is further caused, with respect to calibrating the OPC model, to:
determine a delta between the first function and the second function;
add the delta to either the first function or the second function; and
calibrate the OPC model based on a sum of the added delta and either the first or second functions.

17. The apparatus according to claim 15, wherein the substrate comprises a patterned photoresist layer and/or an etched silicon wafer.

* * * * *